United States Patent [19]
Drechsler

[11] 4,206,408
[45] Jun. 3, 1980

[54] PROCEDURES AND EQUIPMENT FOR STUDYING SURFACE PHENOMENA THROUGH FIELD EFFECT, BY MEANS OF AN EMISSION POINT

[75] Inventor: Michaël Drechsler, Marseilles, France

[73] Assignee: Etablissement Public dit: Agence Nationale de Valorisation de la Recherche - A.N.V.A.R., Neuilly-sur-Seine, France

[21] Appl. No.: 818,327

[22] Filed: Jul. 22, 1977

[30] Foreign Application Priority Data

Jul. 23, 1976 [FR] France ............................ 76 23512

[51] Int. Cl.² .......................................... G01N 25/00
[52] U.S. Cl. .................................................. 324/451
[58] Field of Search ................... 324/33; 250/306, 307, 250/309, 311

[56] References Cited

U.S. PATENT DOCUMENTS 3,139,746  7/1964  Noller ................................... 324/33
3,394,301  7/1968  Van Oostrom ....................... 324/33

OTHER PUBLICATIONS

Review of Scien. Inst., vol. 41, No. 12, Dec. 1970, pp. 1812–1816.
Hopkins et al., "The Surface Potential of Carbon Monoxide, Nuovo Cimento", (Ital.), vol. V, No. 2, 1967, pp. 535–545.
Ermrich, W., "Influence of Slow-Electron Impact Etc.", Phillips Research Reports, vol. 20, 1965, pp. 91–105.
Gauthier et al., "Description d'un dispositif etc.", Le Vide, vol. 24, No. 140, Mar–Apr. 1969, pp. 109–115.

Primary Examiner—M. Tokar
Attorney, Agent, or Firm—Lewis H. Eslinger

[57] ABSTRACT

A device for investigating surface phenomena by field emission contains an emission point in an evacuatable enclosure facing a fluorescent screen. The point is desorbed by a first pulse which produces sufficient heating of the point to attain substantially complete desorption and field emission or field desorption is produced by a second pulse spaced a controllable time after the desorption pulse. Repetitive measurements are possible by producing a train of the first and second pulses during which parameters can be varied and the results observed. Methods are disclosed for determining the temperature of the point from the measured field emission both by relating field emission to temperature and by relating temperature to desorption.

22 Claims, 5 Drawing Figures

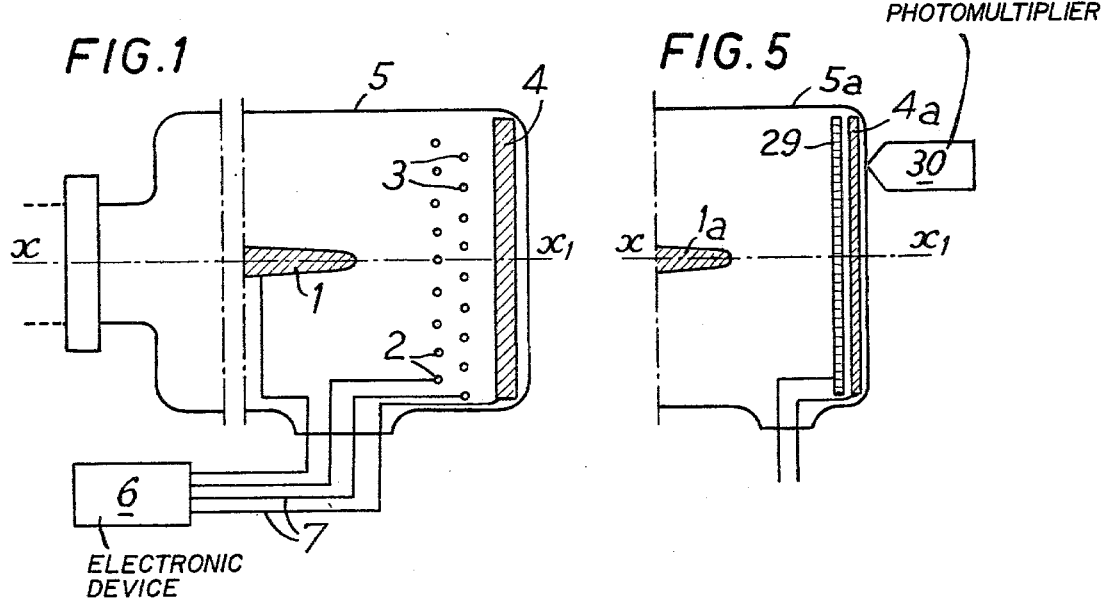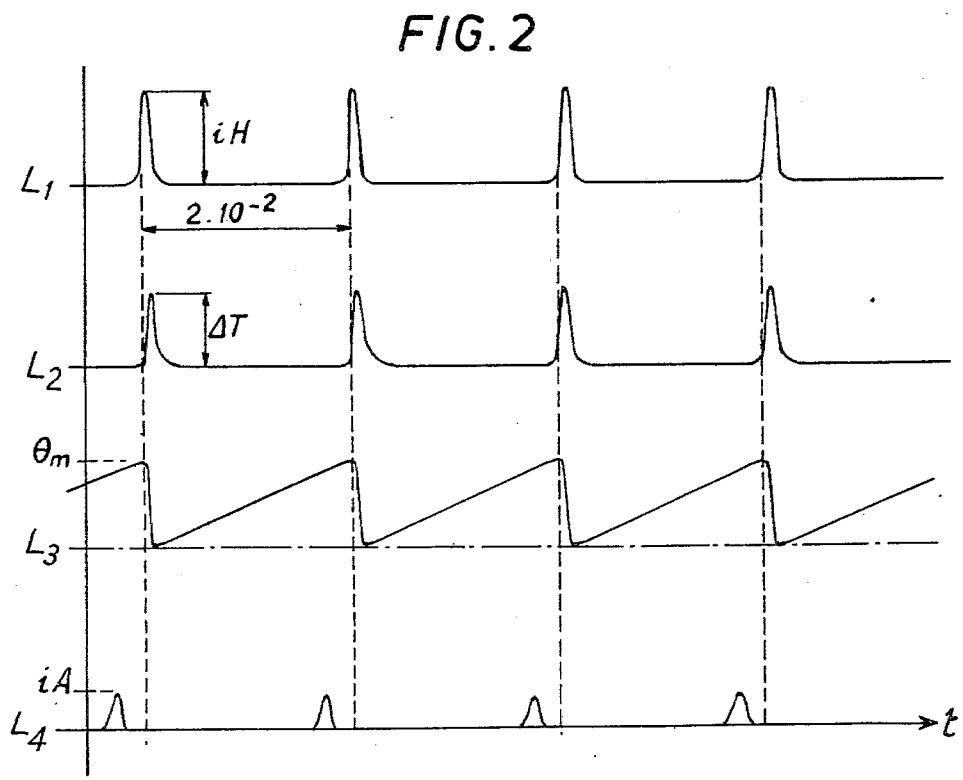

PROCEDURES AND EQUIPMENT FOR STUDYING SURFACE PHENOMENA THROUGH FIELD EFFECT, BY MEANS OF AN EMISSION POINT

The object of the present invention is the procedures and equipment for studying surface phenomena through field effect, by means of emission points.

It is known that important progress has been made in the study of surface phenomena—for example, in studying adsorption and desorption of gases—by means of emission points placed in a fixed, high-vacuum space and brought to a high potential such that they emit particles, electrons or ions, pulled from the point's surface by the intense electric field at the extremity of the point, and by use of the field effect.

Let us briefly consider, by way of example, the successive stages in the study of the interaction of a gas with the surface of a metal point by means of a field electron microscope.

The extremity of the emission point is first cleaned by heating in the high vacuum. The heating is then cut off and cooling is allowed to set in. A gas is introduced into the evacuated space, which leads to adsorption by the point. The high vacuum is then reestablished. The point is maintained at a definite temperature for a certain period, during which a surface phenomenon—adsorption or desorption, for example—is produced.

The microscope voltage is then set to observe and measure the condition of the surface. The duration of an experiment of this type is of the order of $10^3$ seconds, which does not permit study of the kinetics at fast phenomena and forces long-term experiments for studying the kinetics of slow phenomena.

The purpose of the present invention is to improve basically the means utilized at the present time for studying the kinetics of surface phenomena through field emission, and expecially to devise efficient procedures and equipment for the purpose of:

1. Permitting shorter-term experiments and repeating them automatically at high cyclical rates, with the duration of the experiment and temperatures constant and well defined;

2. Measuring transient surface conditions—for example, conditions lasting about $10^{-2}$ seconds;

3. Making measurements in the presence of a gas under internal pressures of 1 Pa ($10^{-2}$ millibar);

4. Avoiding errors due to impurities;

5. Measuring and analyzing the vacuum in a space under a broad range of pressures.

The procedures of the invention for studying surface phenomena by means of an emission point through field effect in a vacuum space consist in a known way of subjecting this point to periodic experiments, each one of which comprises three successive phases: a first phase of preparing the point, a second phase of experimentation during which the point adsorbs a gas in the aforesaid space, and a third phase of analyzing the condition of the point by emission or desorption.

The purpose of the invention is attained by a procedure in which, on application to the emission point of pairs of very short pulses belonging respectively to two trains of periodic and synchronous pulses, the first pulse of each pair producing a defined desorption of the surface of the point corresponding to the first preparation phase and the second pulse of each pair producing a field emission or desorption of the said point which permits analyzing the condition of the said point and which corresponds to the third analysis phase, and the period separating the two pulses of each pair defines the period of each experiment.

The basic idea of the invention is to repeat automatically the measurement of a surface phenomenon in periodic fashion as a result of the synchronous emission of two trains of very short periodic pulses which determine the beginning and end of each phase of an experiment, the first of these pulses producing an initial defined condition of the surface of the point, and the second an electron or ion emission permitting analysis of the condition of the point at the moment of the second pulse. It is thus possible to study the kinetics of a phenomenon by varying in progressive fashion, in the course of successive cycles, the period of the pulses and/or the phase difference between the two pulses, all other factors remaining the same.

The first phase of each cycle is a preparation phase of the point in the course of which the surface of the crystal situated at the extremity of the emission point is brought to a well defined condition, always the same, such that the initial conditions of the different successive experiments are always the same.

One characteristic of the invention is that, in the course of the preparation phase, the surface at the extremity of the point is cleaned while heating it rapidly and focally, in a very short time, to a temperature at which a well-defined desorption is attained. One can also conduct, independently of the cleaning process and in the course of the preparatory phase, operations causing a field desorption or a change in condition or structure of the crystal placed at the extremity of the point.

The second phase of each cycle—the experiment phase—has the function of establishing the defined experimental conditions, especially a given temperature of the point, and of letting a surface phenomenon proceed during a given period. Where low temperatures below the ambient level are involved, they can be obtained by using the cooling methods customary in ionic field microscopy, for example by utilizing an equipment in which the conducting wire of the point runs through a cryogenic liquid.

Where temperatures above the ambient are concerned, they can be obtained by using the heating means customary in field emission microscopes in which the emission point is mounted on a heating loop energized by a circulating electric current.

In the course of the experiment phase, the surface condition changes under the influence of the experimental conditions. For example, some molecules of a gas or vapor are adsorbed.

The third phase of each cycle is the analysis phase during which a study is made of how the condition of the point surface has changed in the course of the experiment phase as a result of the electronic emission or the ionic field desorption.

In an initial application of the invention, this analysis is obtained by making measurements of the electron pulses emitted by the point when given a negative voltage pulse.

The electron current depends on the work function; when measured, it yields information concerning the degree of covering of the adsorption layer.

In another application of the invention, an analysis of the point is obtained by studying the ionic field desorption of the ad-atoms after initiating it by a positive voltage pulse.

The number of ions or the current emitted by a part of the surface can be measured by using an ion or secondary electron amplifier, for example, to obtain quantitative information on the extent of covering just before the field desorption.

A fluorescent screen placed opposite the point will show, in the course of each phase of the analysis, an image of the field emission produced by electrons or ions, through which information can be periodically obtained on the condition of the surface at the extremity of the point and on the nature of the ad-atoms.

The invention provides new procedures and equipment for studying surface conditions by periodic field emissions.

As a result of the procedures supplied by the invention, the periodic repetition of an experiment permits observation, measurement, and analysis of the instantaneous condition of a surface in a very short time (for example, $10^{-5}$ seconds) after an experimental phase in which the extremity of the point is maintained for a definite period—for example, $10^{-2}$ seconds—in the given experimental conditions. Either the experimental parameters or the duration of the experimental phases can be progressively varied.

Thus, a study can be made, for example, of how the condition of the surface of an emitting point evolves if, in the course of each cycle, one or several parameters such as the temperature or the partial pressure of a gas are varied with the duration of the experimental phase held constant.

The time between the instant of the measurement and the beginning of the experimental phase is determined by the period and/or the difference in phase inside each cycle between the preparation pulse and the analysis pulse, and the ease with which the electronic equipment can vary the period or the phase difference between two trains of synchronous pulses.

By varying this period and/or phase difference without modifying the experimental conditions, the kinetics of the phenomenon can be observed as a result of successive measurements whose changes vary in accordance with the beginning of the experimental phase.

The following description refers to the attached drawings which represent, as examples with no characteristic limits, equipment for operating the invention.

In describing the operation of this equipment, a detailed description will be given of the different stages of the procedures of the invention.

FIG. 1 is the schematic of an axial section of an important device for the invention.

FIG. 2 is a diagram of the electrical pulses of the equipment of FIG. 1.

FIG. 5 is a section of a part of a device in FIG. 1 for field desorption.

Figure 3:
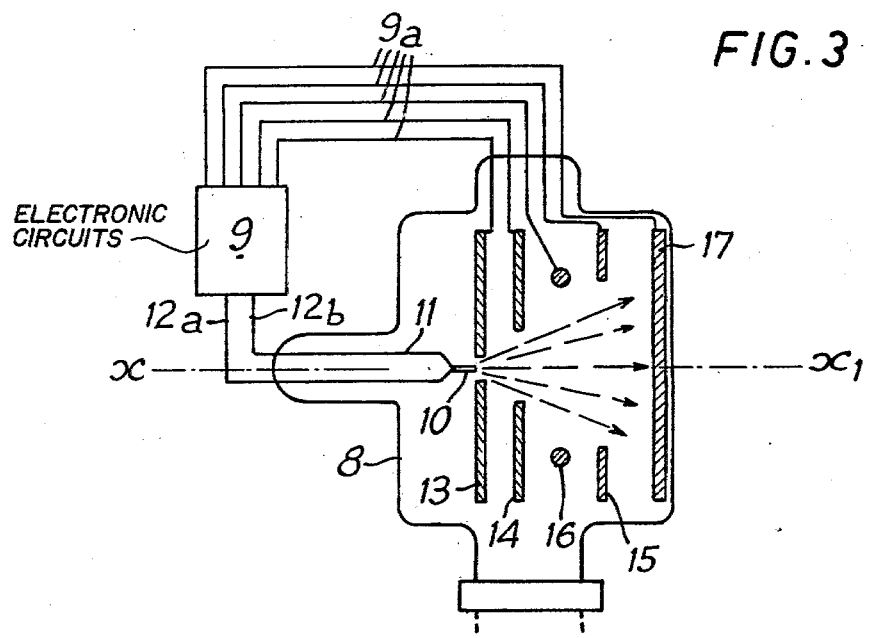
FIG. 3 is the schematic of an axial section of a second device for the invention.

If the preparation phase involves a heating phase for the emission point, it is necessary to use a particular heating procedure through which the cooling time can be cut very short as a result of concentrated heating of the extremity of the point. Actually, the usual heating modes of an electric current flowing through a heating loop lead to cooling times greater than one second because of the thermal inertia of the loop, and such cooling periods will not permit the realization of short-term measurement cycles and higher cyclical rates of experimentation.

In a major solution, the extremity of the point is bombarded by high-energy particles such as electrons, ions, neutrons or photons. To obtain a temperature rise centered at the point's extremity, these particles can be focused on the extremity by lenses.

As a variant, the point may be masked partially such that only a little point zone of the extremity is under bombardment.

In a second solution, the extremity of the emission point can be heated by an emission current in a field effect—i.e., simultaneously by heating due to electrons detached by the field (the Nottingham effect) and by the Joule effect due to the field emission current flowing across the fine part of the cone of the point.

In all cases, the heating during the preparation phase is short (between $10^{-1}$ and $10^{-5}$ seconds) produced or initiated by a voltage pulse.

FIG. 1 is a very schematic representation of an axial section of a device for operating the invention.

This device is placed in the interior of a sealed space 5, kept under vacuum by means of an evacuating pump which is not shown. The reference mark 1 designates the extremity of a very fine metal point—of tungsten, for example—on the x axis. The reference mark 4 represents a fluorescent screen perpendicular to the x axis, which simultaneously serves as an electrode.

Reference marks 2 and 3 represent two grids formed by metal wires to which definite potentials are applied. Reference mark 6 designates an electronic device connected through conductors to point 1, to grids 2 and 3, and to the screen 4.

Point 1 and screen 4 are the essential elements of an electronic field microscope; if a potential difference of several thousand volts is set up between points 1 and 4, the screen 4 will show the image of the crystal on the extremity of the point.

The abscissae of FIG. 2 represent time, and the ordinates of the four lines $L_1$ to $L_4$ represent the variations in shape of periodic pulses of various parameters.

The line $L_1$ represents the very short pulses of the electronic field emission current, of amplitude $i_H$, emitted by point 1 with a period of $2.10^{-2}$ seconds during each preparatory phase. These pulses are initiated by short negative-voltage pulses emitted by device 6.

The line $L_2$ represents temperature variations at the extremity of the point. The current pulses $i_H$ cause a very rapid temperature increase at the extremity of the point amounting to $\Delta T$, and after each pulse the temperature again drops very rapidly because the heated volume is very small. The temperature increase $\Delta T$ is sufficient to induce desorption of the adsorption layer, which again covered the point at the end of the preceding cycle.

In this example, it is assumed that the sealed space 5 also contains a gas under reduced pressure and that the experiment in progress has the purpose of studying the phenomenon of adsorption of this gas by the surface of the point, and of measuring the pressure of the gas in space 5 by using this adsorption phenomenon.

The end of the heating phase corresponds to the beginning of the experimentation phase. In the case of the figure, the extent to which the point is covered by the adsorbed gases is zero at the beginning of each experimental phase, and increases linearly during the entire experimentation phase until the maximum value $\theta_m$. The variations in the extent of the covering are represented by the graph as sawteeth of the line $L_3$, each sawtooth corresponding to a cycle.

At a given instant of the experimentation phase, the analysis phase occurs. This latter phase is initiated by a short negative pulse applied to point 1 by the device 6. The amplitude of this pulse is weaker than the pulses of the preparatory phase. The line $L_4$ of FIG. 2 represents the electronic field current pulses of amplitude $i_A$, emitted by the point during each analysis phase. These pulses $i_A$ theoretically cause heating of point 1, but the effect is negligible because $i_A$ is very small compared to $i_H$.

The amplitude and eventually the shape of the pulses $i_A$ are measured by an oscillograph or a peak voltmeter. This amplitude can also furnish quantitative information on the gas pressure in the space since $i_A$ depends on the electron work function and consequently on the extent of the covering, which in turn depends on the pressure, the time, and the nature of the gas; the amplitude $i_A$ can therefore be used to measure the residual pressure in the space if the nature of the gas is known.

The nature of the gas in the space can be determined by observing on screen 4 the image of the extremity of the point produced by the electronic field emission $i_A$. This image is characteristic of the nature of the absorbed layer and therefore of the nature of the gas in the space.

The observation of images on the fluorescent screen in this case raises a problem because the images produced in the course of pulses $i_A$ and $i_H$ are superposed, and the more intense image corresponding to $i_H$ interferes with observation of that corresponding to $i_A$. To overcome this problem, the device of FIG. 1 contains, between point 1 and the screen 4, two grids 2 and 3 of fine metal wires.

During the preparatory phase, grid 2 is at a positive potential and serves as anode, while grid 3 is at a negative potential which repels toward the wires of 2 the electrons that have passed those wires. During the analysis phase, the wires of 2 and 3 are at the same positive potential as the screen 4, and permit free passage to the screen of the electrons coming from point 1 or from an essential part of the wires, such that an image appears on screen 4 only during the analysis pulses $i_A$.

It might be interesting to be able to obtain information of the pressure and nature of the gas in a broad range of pressures.

If the pressure in the space is relatively high (between 1 and $10^{-2}$ Pa) an adsorption layer forms relatively quickly, in a time of the order of $10^{-3}$ seconds, and there is the risk that the analysis phase will occur after adsorption saturation is attained, or is almost attained; in that case, measurement of the pressure inside the space becomes inaccurate. To obtain precise pressure measurements in this pressure range, the period of the experiments is varied—for example, by varying the frequency of the time base in device 6 which synchronizes the pulses. If the period is reduced, the duration of each cycle is shortened and the analysis pulse $i_A$ intervenes at a moment when the formation of the covering layer is not yet complete.

Without modifying the period and duration of the cycles, one can also use a phase-shifting electronic circuit to shift the analysis phase toward the beginning of the experiment phase.

Such phase-shifting allows the analysis pulse $i_A$ to be produced at a moment of the cycle in which the formation of the covering layer is not yet finished.

If the pressure measured in the gap is relatively low—for example, for pressures between $10^{-4}$ and $10^{-10}$ Pa, one can on the other hand prolong the duration of the cycles. For extremely low pressures, less than $10^{-10}$ Pa, periods lasting an hour or more are chosen.

To accelerate the absorption during the experimental phase, point 1 can be given a positive potential such that the electric field at its extremity attains a value of the order of $10^8$ V/cm and is still lower than the desorption potential. The gas pressure is raised locally around the extremity of the point, and the time required for the adsorption is considerably reduced.

Furthermore, if the gas contains a component with a high dipole moment, even in a very weak proportion, its adsorption is accelerated and rendered visible and measurable.

A device that measures the gas pressure in a space like that just described has the advantage that the measurement has practically no effect on the pressure itself. On the contrary, ordinary manometers and vacuum gauges may provoke phenomena of pumping, of the memory or variation of the composition of the gas mixture, as the result of a reaction with the heated surfaces. These bothersome phenomena in the low-pressure region are practically eliminated by the equipment of the invention where the area of the heated surface is very small.

FIG. 3 is an axial section of another device of the invention with another mode for heating the extremity of the point during the preparation phase.

This equipment contains a space 8, in glass, for example, which is evacuated by means of an evacuating pump not shown.

Space 8, on the x axis, contains an axial emission point 10 on a heating loop 11 connected by two electrical conductors 12a and 12b.

The space 8 contains three electrodes, 13, 14, and 15, formed by discs or plates pierced by a window centered on the x axis. It contains a cathode 16 in the form of a metal ring whose axis coincides with the x axis between electrodes 14 and 15.

Finally, the space 8 contains a fluorescent screen 17 as the target for particles emitted by point 10.

The device contains two electronic circuits 9 connected by conductors 9a to the electrodes and to the screen.

In this example, point 10 is heated during the preparatory phase by electronic bombardment. In this phase, the cathode 16 is given a high negative voltage pulse, and the electrons it emits are accelerated by electrodes 13, 14, and 15, urging their arrival at the point with an energy of several keV. The local field around the point, which is given a positive potential, focuses the trajectories on the extremity of the point. The intensity and duration of the voltage pulses can be controlled to provide a temperature of desired value—2500° K., for example—at the extremity of the point during the heating phase.

The equipment shown in FIG. 3 permits the introduction of a series of measures to vary the temperature of the point, from one cycle to another, during the experimental phase. One can thus study the evolution of a phenomenon in a broad range of temperatures, from temperatures below ambient to very high levels. The temperatures during the experimental phase can be obtained by cooling and heating techniques usually used in field emission microscopy; namely, cooling by liquid nitrogen or hydrogen, and heating by passing an electric current through the loop 11.

The precise determination of the temperature of the point and of the very rapid variations of that temperature is necessary to study the surface phenomena and constitutes a problem difficult to solve.

The devices of the invention supply interesting solutions for this problem.

In accordance with a known method, the electrical resistance of the heating loop 11 can be measured and from it the temperature of the extremity of the point and its variations can be deduced by complex calculations yielding rough results.

A device of the invention permits measurement of the temperature at the end of the point with a new thermometer we can call an electronic field thermometer, consisting of the device itself.

The procedure is based on the fact that the electron current intensity due to the field emission is a known function of the temperature which may be measured in a preliminary calibration. This dependence is weak but is sufficient for temperature measurements.

The invention is such that according to a preliminary calibration procedure, a high vacuum is established in the space 8, and point 10 is subjected to a series of very short pulses of highly negative voltage and of equal amplitude during the heating of the point, which causes pulses of electronic field current.

The current amplitude or the number of electrons emitted during each pulse is measured, and these measurements indicate, from a precalibration of the current intensity versus temperature, the instantaneous temperature at the extremity of the point at the moment of the pulse.

With several successive pulses, one can follow the very rapid temperature variations with no inertia on the part of the measuring device. Of course, the voltage pulses utilized are extremely narrow and relatively weak so that the electron current emitted by the point changes the point's temperature only slightly.

Following another technique, one can also deposit a well-defined adsorption layer on the surface of the point itself during a phase of the preliminary calibration and before heating, and then observe the desorption of the layer in an electron field microscope. This supplies information concerning the temperature variations at the extremity of the point.

From the adsorption of different substances, such information can be obtained in different temperature ranges.

Through a device of the invention, the temperature of the point's extremity can be very precisely determined during the heating pulses.

Let us suppose, by way of example, that a tungsten point (10) is heated from the ambient level to a temperature of about 2000° K. by a pulse causing bombardment of the point, the duration of the pulse being of the order of $10^{-3}$ seconds, and that we want to determine at what precise moment the temperature at the point's extremity passes through a particular value, 860° K., for example. In a preliminary phase, we introduce into space 8 a calibration gas under a pressure that will provide on point 10, at ambient temperature, a constant desorption layer. For example, hydrogen under a pressure of $10^{-3}$ Pa is introduced into space 8. Before measuring the temperature, we measure, in the classic fashion, the desorption of this layer as a function of the temperature—by means of an electron field microscope, for example—by using relatively low temperatures which lead to relatively long desorption durations, of the order of 10 to $10^5$ seconds.

The law of Arrhenius permits us to determine by extrapolation the temperature at which the layer is very rapidly desorbed.

Let us suppose, for example, that this extrapolation shows that the desorption is attained in less than $10^{-5}$ seconds for a temperature of 860° K.

With this result known, we set up a periodic operation, in accordance with the invention procedure, consisting of three successive phases during each measurement cycle and, in the course of successive cycles, we systematically increase the phase shift between the beginning of the heating pulse and the beginning of the analysis pulse.

Observation of the image of the point on the screen 17 or measurement of the amplitude of the analysis pulses $i_A$ permits determination of the degree of covering at the moment of the analysis pulse, and this degree decreases as the phase shift increases. We can thus determine the phase shift corresponding to a zero degree of covering—$2.10^{-4}$ seconds, for example—and we therefore know that for a given point and heating pulse, the temperature of the extremity of the point passes 860° K. at the end of $2.10^{-4}$ seconds after the beginning of the heating pulse.

By successively using several gases or gas mixtures with different desorption temperatures, one can thus determine the curve for the rapidity of temperature rise at the extremity of the point in a very narrow time range, of the order of $10^{-2}$ seconds, for example.

With a device of the invention, one can also determine the curve for the rapidity of the temperature drop by systematically increasing the phase difference between the beginning of the heating pulse and the analysis pulse over successive cycles. We thus observe on the screen 17 that, for a particular phase shift, the degree of covering recommences its increase after having passed a minimum of practically zero. This phase shift corresponds to the temperature, theoretically known, at which the speeds of desorption and adsorption are equal.

Measurement of the temperature at the extremity of the point and of the periodic and very rapid variations of the temperature is of real interest for the operation of the procedures and equipments of the invention. It permits an arrangement in which the temperature at the extremity of the point at the beginning of the experimental phases is actually the ambient temperature. It permits us to establish, in the course of the experimental phases, a well defined constant temperature. This is very important in studying surface phenomena which are highly sensitive to temperature. It also permits variation of the temperature during the experimental phase, in the course of successive cycles, in accordance with a definite law, in order to study the effect of temperature on the kinetics of a surface phenomenon. Finally, it permits measurement of the heat releases in the course of surface phenomena at the extremity of the point accompanied by a release or acquisition of calories.

Figure 4:
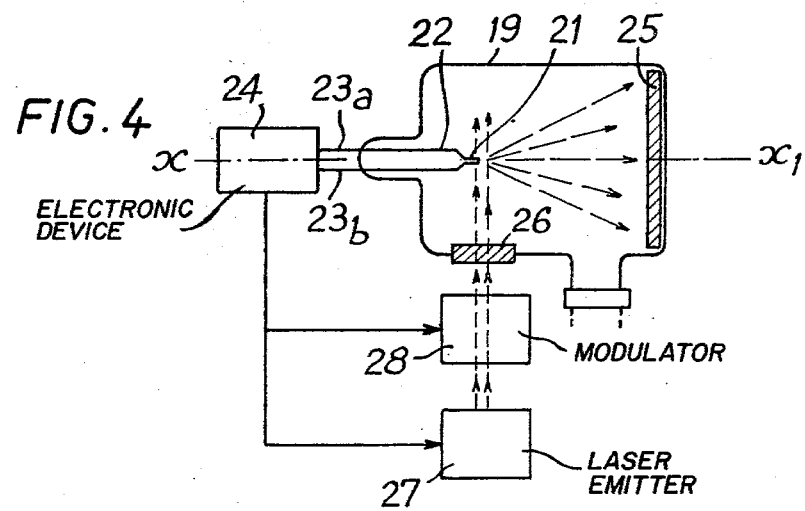
FIG. 4 is the schematic of an axial section of a third device for the invention.

FIG. 4 is the schematic of an axial section of the variant of an invention device in which the emission point is heated by laser bombardment.

This device involves a sealed space 19 on the x axis, maintained at a vacuum by an evacuating pump not shown. Inside this space is an axially arranged emission point 21, connected by a heating loop 22 with two external conductors 23a and 23b which connect the loop to an electron device 24. The space 19 contains a fluorescent screen perpendicular to the x axis. It has a transparent lateral window 26, opposite which is the point 21. A laser emitter 27 is opposite the window 26. A mechanical or electronic modulator 28 may be associated with emitter 27 to modulate the laser intensity if the latter is steady. As a variant, the emitter 27 can give off periodic pulses synchronized with the measurement cycles. The laser beam enters the space 19 through window 26 and falls on the extremity of point 21, which is focally heated.

The amplitude to be measured of the electronic field emission pulses emitted by point 21 is a function of the temperature. Within one period, for example, ten field emission pulses can be prevoked, and the temperature can thus be measured in ten different instants after calibration. Furthermore, these ten amplitudes can be displayed on the screen of an oscillograph to permit the visualization of ten points on the curve of temperature evolution as a function of the time, within a period and for all periods.

With the equipment of FIG. 4, the intensity can be varied of the laser within each period, and point 21 can be heated by the laser beam in the preparation and experimental phases.

To obtain a constant temperature in the experimental phase, the intensity of the laser beam is regulated by the modulator 28 in each phase of the cycle, and each time the oscillograph screen is checked to see whether a step in the control of the modulator renders the temperature more or less constant during the experimental phase. Once the change in temperature is well controlled, the experiments proper can be begun by introducing a gas into space 19, for example, which does not modify the temperature, and by proceeding with the periodic study.

The heating by laser rays can be replaced by a light beam or by any other electromagnetic radiation concentrated on the extremity of the point with the aid of lenses or mirrors, and passed through a modulator, which permits the periodic variation of the intensity of the radiation incident on the point.

The preceding description shows how the procedures and equipment of the invention permit a simultaneous study of the kinetics of surface conditions and also the measurement and regulation, in preliminary calibration phases, of such very important parameters as the degree of vacuum and the temperature of the point during the preparation phase as well as during the experimental phase of each cycle.

For certain experiments, it might be interesting to measure the electron current emitted by just one face of the point or by one part of that face. In that case, the fluorescent screen, like screen 25, has a little hole behind which is placed a Faraday mesh or an electron multiplier used to measure or count the number of electrons or ions passing through the hole. In that case, the point is movable before the fluorescent screen so that any face of the point crystal can be placed before the hole.

The equipments which have just been described are connected with applications in which the electrons emitted by the point through the field effect are used during the analysis phase.

The equipments of the invention can be of equal use in the procedures during which the analysis phase is made up of a field desorption pulse produced by subjecting the point to a a highly positive voltage pulse. The atoms or molecules desorbed or vaporized by the field then produce on the screen an image of the surface at the extremity of the point (field desorption microscope).

FIG. 5 shows a part of an equipment shown in FIGS. 1, 3, or 4, modified to make certain experiments by using field desorption. The parts homologous to those of FIG. 1 are represented by the same symbol followed by the latter a.

An image amplifier 29 of the "channel plate" or double "channel plate" type, a known device consisting of tubes juxtaposed to emit electrons when they capture an ion and showing on the screen 4a the impact of just one ion, is placed before the screen. If the point 1a is only slightly covered, the extent of the covering can be simply determined by counting the ions forming the image on the screen or in a photograph of the screen taken during each desorption pulse. If the covering is more extensive, counting the ions becomes difficult since the ion images are superposed on each other. To clarify the image of each ion, the amplifier can be mounted relatively far from the point with a study made of only a small part of the emissive surface, or an amplifier 29 with a greater number of tubes can be used.

One can also place a photomultiplier 30 opposite a zone of the fluorescent screen 4a. The light emitted by this zone during each desorption pulse is a function of the number of ions received by a unit surface of amplifier 29, and therefore of the number of desorbed ions.

The amplitude of the current pulse produced by photomultiplier 30 thus furnishes quantitative information concerning the degree of covering of the point 1a at the moment of each desorption pulse.

Measurements of the covering, obtained through periodic study by the procedures and equipment of the invention in combination with pressure and temperature measurements, make possible the study of the kinetics of surface phenomena as a function of certain parameters and permit measurement of fundamental values such as the heat of adsorption.

A very interesting advantage of the procedure of the invention is the short duration of experiments permitting the multiplication of measurements by varying certain parameters.

Furthermore, the effect of the impurities which impede and upset study of the kinetics of surface phenomena is substantially reduced. The emission point is actually cleaned in the course of each preparation phase, which is the first phase of each cycle. In the routine case when the duration of each cycle is of the order of $10^{-2}$ seconds, the number of impurity molecules deposited on the surface of the emission point in that small length of time is obviously much lower than in an experiment lasting $10^3$ or $10^4$ times longer.

The procedures and equipments of the invention can thus be used for experiments under extremely clean conditions, where other known methods cannot be used, that can be performed in a study in depth of the kinetics of surface phenomena in a very much shorter time.

If the analysis phase is a desorption phase, the point is cleaned during this phase, and in certain cases the preparation phase of the next cycle, which is then confused with the analysis phase of the preceding cycle, can be suppressed.

The recording of the images which appear on the fluorescent screen in each analysis phase can be made by a camera synchronized with the period of the measurement cycles.

A device of the invention can be combined with an electronic device to measure the time between desorption pulses and the impact of the desorbed ions on the screen, thus permitting determination of the mass of the ad-atoms and constituting a mass spectrometer of field ions—for example, an ion field microscope for analyzing the surface atoms or a transit-time ion field mass spectrometer combined with a field desorption microscope. Combinations of this type can yield information on the mass and therefore the characteristics of the adsorbed ions.

For example, in a combination of the instrument of FIG. 5 for desorption with an ion field mass spectrometer, use is made of an image amplifier 29 made up of a special "channel plate" of the Chevron-Cema type with a delay aperture. This image amplifier is normally closed but can be opened (time gating) during a very short time of the order of $10^{-7}$ seconds, this aperture being triggered by a pulse supplied by an electronic circuit. The time between the desorption pulse and the pulse opening the image amplifier can be varied such that only one part of the desorbed ions appears on the screen—those whose tranist time required for the trajectory separating the extremity of the point from the image amplifier is equal to the time between the two pulses; i.e., ions of a certain mass. By systematically varying the phase difference between the two pulses during successive measurement cycles, the mass and concentration of all the adsorbed molecules can be measured. Such a combination opens new study possibilities. For example, at the time of a gas-metal reaction or a catalytic reaction between well defined gases at a metal surface, the characteristics and connectration of all the molecules on the different faces of a metallic monocrystal can be measured. One can measure in situ the effect of a parameter like the temperature of the metal, the concentration of a substance, the temperature and pressure of the different gases. One can also measure the speed of the reaction.

In conclusion, it can be said that the procedures and equipments of the invention, utilizing periodic field emissions, permit obtaining in a short time information on the kinetics of surface reactions that is much more complete and precise than that obtained by known methods.

Without departing from the framework of the invention, of course, the component parts of the equipments just described by way of example can be replaced by equivalent elements.

I claim:

1. Procedure for studying surface phenomena by field effect through the use of an emission point in an evacuated space subjected to periodic experiments, each experiment consisting of three successive phases, a first phase of preparation of the point, a second phase of experiment during which the point adsorbs a gas in the said space, and a third phase of analysis of the cndition of the point, comprising applying to the emission point a periodic train of pulses made up of spaced pairs of very short pulses, the first pulse of each pair being effective to heat said point to produce a determined desorption of the surface of the point corresponding to the first preparation phase, and the second pulse of each pair being effective to produce emission or field desorption of the said point, measuring the emission or field desorption, and varying the spacing between the two pulses of each pair in progressive fashion in the course of successive experiments, and thereby varying the duration of the experimental phase progressively in the course of successive experiments to permit study of the kinetics of the phenomena.

2. Procedure of claim 1, in which said first pulse of each pair focally heats the extremity of said emission point in a very short heating time to a temperature such that a predetermined desorption of the point is obtained.

3. Procedure of claim 2, in which the heating step comprises emitting electrons by an auxilliary electrode, accelerating said electrons by the first pulse of each pulse pair and focussing the accelerated electrons on the extremity of the point.

4. Procedure of claim 2, in which the first pulse of each pair of pulses is a pulse of electromagnetic radiation.

5. Procedure of claim 2, in which the first pulse of each pair of pulses is a high negative voltage pulse applied to the extremity of the point said negative voltage pulses being effective to provoke a strong electronic field emission.

6. Procedure of claim 2, comprising introducing a gas of determined calibration into the space containing the point, said gas having a known curve of desorption as a function of the temperature, maintaining the pressure of said gas such that at the ambient temperature the point is covered by a constant adsorption layer, applying said pairs of pulses, measuring the amplitude of the field emission electronic current pulses emitted by the point at the time of each analysis pulse, comparing the measured amplitude with the known curve of desorption to determine the degree of desorption of the point at the time of the analysis pulses, measuring the time between said pairs of pulses corresponding to a definite desorption which furnishes the required time spacing to attain the temperature corresponding to this desorption.

7. Procedure of claim 6 comprising repeating the procedure for a plurality of other calibration gases with different curves of desorption as a function of the temperature and temperatures of equilibrium between the different speeds of adsorption and desorption, a point in the rise and a point in the drop of the desorption with temperature and plotting a curve of the temperature of said point at a plurality of said points in the rise and points in the drop for said plurality of calibration gases.

8. Procedure of claim 4, wherein said electromagnetic radiation is laser radiation.

9. A device for studying surface phenomena by field effect comprising:
   a field effect emission point;
   a sealable enclosure enclosing said emission point;
   a fluorescent screen in said enclosure facing said point;
   desorbtion means for applying at least one heating pulse to said point effective to substantially desorb said point;
   analysis means for applying at least one analysis pulse a predetermined time after said heating pulse to said point effective to produce field emission or field desorbtion at said point; and
   electrical means for urging electrons emitted by field emission or ions released by field desorbtion toward said fluorescent screen whereby an image is formed thereon.

10. Device of claim 9, wherein said desorbtion means comprises:
    a source of electrons in said enclosure; and means for accelerating and focusing said electrons onto said emission point whereby said emission point is heated.

11. Device of claim 9, wherein said desorption means comprises a power supply effective to apply a negative pulse to said point of sufficient magnitude and width to heat said point.

12. Device of claim 9, wherein said desorption means comprises electromagnetic radiation means.

13. Device of claim 12, wherein said electromagnetic radiation means comprises a laser.

14. Device of claim 13, wherein said electromagnetic radiation means is effective between said first and second pulses to heat said point.

15. Device for realizing the procedure of claim 4 comprising a field effect emission point placed in a high vacuum sealed space, said space containing a fluroescent screen facing said emission point, a window which is transparent to electromagnetic rays located opposite the extremity of said point, a laser emitter of electromagnetic radiation opposite said window, electronic circuits connected to said point, to said screen and to said laser emitter, said electronic circuits having means for producing first and second trains of periodic very short pulses in synchronism and means for applying to said laser emitter said first train of pulses and means for applying to said point said second train of pulses.

16. Device for realizing the procedure of claim 5 comprising a field effect emission point in a high vacuum sealed space, electronic circuits connected to said point, said electronic circuits having means for producing in synchronism a first train of short, periodic, high amplitude negative-voltage pulses and a second train of short, periodic, high-voltage pulses whose amplitude is substantially smaller than amplitude of the pulses of said first train; the pulses of said first train being heating pulses effective to locally heat the extremity of said point and the pulses of said second train being analysis pulses effective to produce electronic emission or ionic desorption of said point by field effect.

17. Procedure for electronically measuring temperature variations of an emission point placed in a space of high vacuum while the extremity of said point is being heated comprising subjecting said point to successive very short high negative voltage pulses which provoke electronic emission by field effect, said negative pulses being too short to significantly change the temperature of said point, and measuring the number of electrons emitted during each of said very short voltage pulse which measurement indicates the instantaneous temperature at the extremity of the point at the moment of each pulse.

18. Procedure of claim 1, in which said spaced pairs of very short pulses belong respectively to two trains of periodic and synchronous pulses and said varying progressively of the spacing between the two pulses of each pair is performed by varying the common period of said two trains of periodic pulses in a progressive fashion in the course of successive experiments.

19. Procedure of claim 1, in which said spaced pairs of very short pulses belong respectively to two trains of periodic and synchronous pulses wherein the step of varying the spacing between the two pulses of each pair comprises varying the phase shift between said two trains of periodic pulses in a progressive fashion in the course of successive experiments.

20. Device of claim 9, wherein said desorbtion means and said analysis means comprise electronic circuits connected to said point, said electronic circuits being operative for applying successively to said point said at least one heating pulse and said at least one analysis pulse, said at least one heating pulse being a negative voltage pulse of amplitude effective to cause heating of the extremity of said point by electronic field emission.

21. Device of claim 20, further comprising at least two grids of metal wires between said point and said fluorescent screen wherein said electronic circuits are also connected to said grids and operative for applying to each of said at least two grids simultaneous voltage pulses of opposite polarity which voltage pulses coincide with said heating pulses and are effective to prevent the appearance of an image of the point due to the electronic emission on the fluorescent screen during the said heating pulses.

22. Device for realizing the procedure of claim 3, comprising a high vacuum sealed space, a field effect emission point in said sealed space, a fluorescent screen facing said emission point in said sealed space, said auxiliary electrode being an auxiliary cathode which is a source of electrons, a plurality of accelerating electrodes with an aperture centered on the axis of said point, electronic circuits connected to said point, said cathode, said electrodes and said screen, said electronic circuits having means for applying periodic high negative voltage pulses to said cathode and means for applying a potential between said electrodes and said point which focuses the electrons emitted by said cathode during said negative voltage pulses on the extremity of said point.

* * * * *